United States Patent
Kwon et al.

(10) Patent No.: US 8,621,296 B2
(45) Date of Patent: Dec. 31, 2013

(54) INTEGRATED CIRCUIT DEVICES HAVING SELECTIVELY ENABLED SCAN PATHS WITH POWER SAVING CIRCUITRY

(75) Inventors: Seok-Il Kwon, Seoul (KR); Hoijin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 367 days.

(21) Appl. No.: 13/165,304

(22) Filed: Jun. 21, 2011

(65) Prior Publication Data

US 2011/0320896 A1    Dec. 29, 2011

(30) Foreign Application Priority Data

Jun. 28, 2010    (KR) .................. 10-2010-0061423

(51) Int. Cl.
*G01R 31/28*    (2006.01)

(52) U.S. Cl.
USPC .......................................... 714/726; 714/742

(58) Field of Classification Search
USPC ............. 714/726, 727, 729, 733, 734, 25, 30, 714/724, 742; 377/64, 70, 72–74
See application file for complete search history.

(56) References Cited

U.S. PATENT DOCUMENTS

| | | | |
|---|---|---|---|
| 6,708,315 B2 | 3/2004 | Hosokawa et al. | |
| 7,069,486 B2 | 6/2006 | Nagamine et al. | |
| 7,124,339 B2 | 10/2006 | Sumita et al. | |
| 7,162,673 B2 | 1/2007 | Wong | |
| 7,240,262 B2 | 7/2007 | Takasaki | |
| 7,401,279 B2 | 7/2008 | Sumita et al. | |
| 7,646,210 B2 * | 1/2010 | Cheng et al. | 326/16 |
| 7,743,298 B1 * | 6/2010 | Bhatia et al. | 714/726 |
| 7,844,871 B2 * | 11/2010 | Brandt et al. | 714/733 |
| 2003/0088836 A1 | 5/2003 | Kanazawa et al. | |
| 2009/0172615 A1 | 7/2009 | Ortiz et al. | |

FOREIGN PATENT DOCUMENTS

JP    2003-139824    5/2003

* cited by examiner

*Primary Examiner* — Christine Tu
(74) *Attorney, Agent, or Firm* — Myers Bigel Sibley & Sajovec, P.A.

(57) ABSTRACT

An integrated circuit device includes first and second latches (e.g, D-type flip flops) responsive to a clock signal. Each of the first and second latches respectively includes a data input terminal, a scan input terminal, a scan enable terminal and an output terminal. A combinational logic circuit may be provided, which is configured to receive the signal from the output terminal of the first latch and configured to generate a signal at the data input terminal of the second latch. A scan path is also provided, which is responsive to a scan enable signal. The scan path is configured to selectively pass a signal from the output terminal of the first latch to the scan input terminal of the second latch when the scan enable signal is active. A power saving switch is also provided. This switch, which is responsive to the scan enable signal, includes a first current carrying terminal electrically coupled to the scan path. The switch is configured to disable the scan path from passing the signal from the output terminal of the first latch to the scan input terminal of the second latch when the scan enable signal is in an inactive state.

19 Claims, 7 Drawing Sheets

INTEGRATED CIRCUIT DEVICES HAVING SELECTIVELY ENABLED SCAN PATHS WITH POWER SAVING CIRCUITRY

REFERENCE TO PRIORITY APPLICATION

This application claims priority to Korean Patent Application No. 10-2010-0061423, filed Jun. 28, 2010, the contents of which are hereby incorporated herein by reference.

FIELD

This invention relates to integrated circuits and, more particularly, to integrated circuits including scan paths.

BACKGROUND

As large-scale integrated (LSI) circuits develop into very large-scale integrated (VLSI) circuits, the number of combinational logics included in an integrated circuit has increased. A scan path is used to verify the integrity of the combinational logic in a VLSI circuit. However, the scan path may increase power consumption of an integrated circuit, and may cause reduction of the operating speed. As the number of transistors integrated in a single integrated circuit increases, leakage power consumption is becoming an important issue.

SUMMARY OF THE INVENTION

An integrated circuit device according to embodiments of the invention includes first and second latches responsive to a clock signal. Each of the first and second latches respectively includes a data input terminal, a scan input terminal, a scan enable terminal and an output terminal. A combinational logic circuit may be provided, which is configured to receive the signal from the output terminal of the first latch and configured to generate a signal at the data input terminal of the second latch. A scan path is also provided, which is responsive to a scan enable signal. The scan path is configured to selectively pass a signal from the output terminal of the first latch to the scan input terminal of the second latch when the scan enable signal is active. A power saving switch is also provided. This switch, which is responsive to the scan enable signal, includes a first current carrying terminal electrically coupled to the scan path. The switch is configured to disable the scan path from passing the signal from the output terminal of the first latch to the scan input terminal of the second latch when the scan enable signal is in an inactive state.

According to some embodiments of the invention, the scan enable terminals of the first and second latches are configured to receive the scan enable signal. In addition, the switch is configured to reduce power consumption in the scan path when the scan enable signal switches from an active state to the inactive state. The scan path may include at least one delay device (e.g., buffer) having a second current carrying terminal electrically coupled to the first current carrying terminal of the switch.

According to additional embodiments of the invention, the switch can be an NMOS pull-down transistor. In addition, the scan path may include an inverter having an input terminal configured to receive the signal from the output terminal of the first latch and a logic device having a first input configured to receive the scan enable signal and a second input electrically coupled to an output of the inverter. This inverter may include an NMOS pull-down transistor having a source terminal electrically connected to the first current carrying terminal of the switch (e.g., drain terminal of an NMOS pull-down transistor). According to still further embodiments of the invention, the logic device has a current carrying terminal electrically connected to the first current carrying terminal of the switch. This logic device may be an AND-type or NAND-type logic gate.

According to still further embodiments of the invention, the scan path may include a plurality of inverters electrically coupled in series. The plurality of inverters include a first inverter having an input terminal configured to receive the signal from the output terminal of the first latch. A logic device (e.g., two-input logic device) may also be provided, which has a first input configured to receive the scan enable signal and a second input electrically coupled to an output of a last one of the plurality of inverters.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Hereinafter, exemplary embodiments of the inventive concept will be described in detail with reference to the accompanying drawings.

Figure 1:
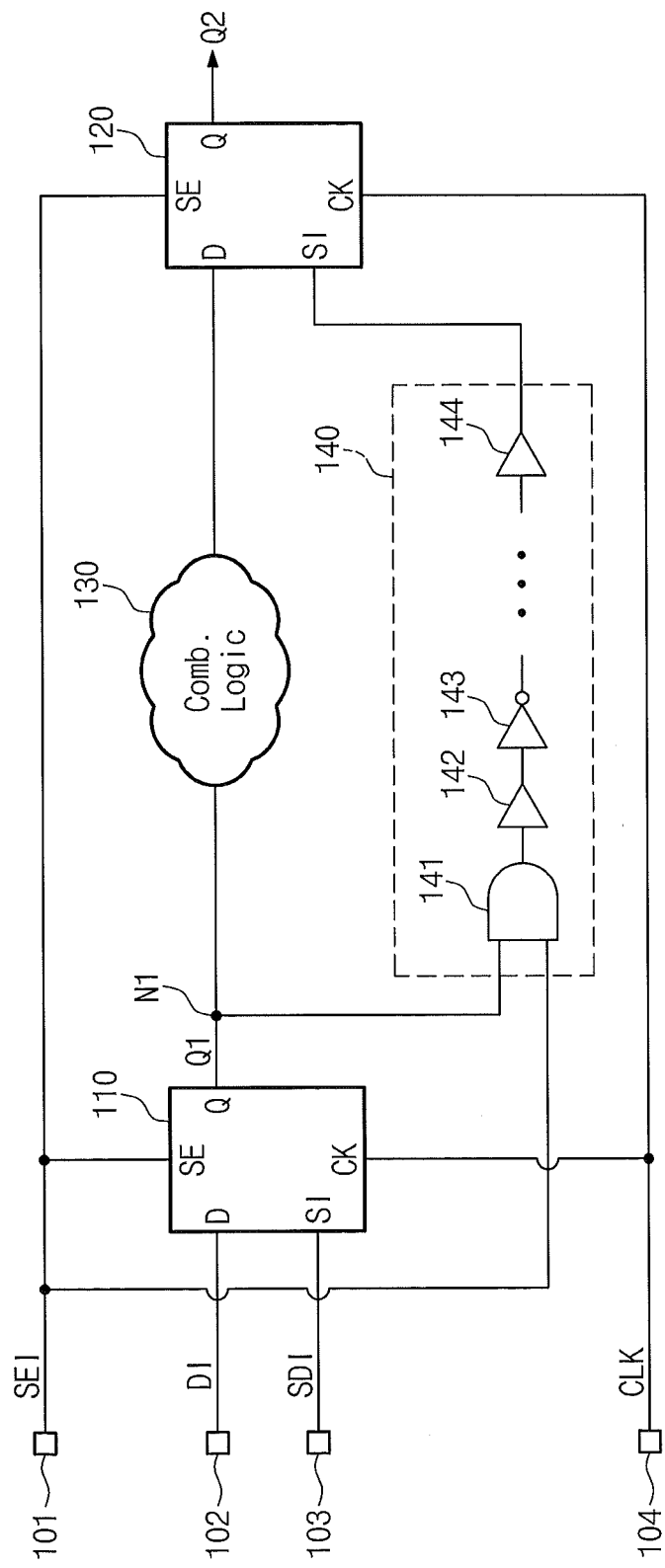
FIG. 1 is a diagram illustrating an integrated circuit according to an embodiment of the inventive concept.

FIG. 1 is a diagram illustrating an integrated circuit according to an embodiment of the inventive concept. Referring to FIG. 1, the integrated circuit may include input terminals 101 to 104, flip-flops 110 and 120, a combinational logic circuit 130, and a scan path 140. The flip-flops 110 and 120 may include a data input D, a scan data input SI, a scan enable input SE, a clock input CK, and an output Q, respectively. The flip-flop 110 may receive a scan enable signal SEI from the input terminal 101 via the scan enable input SE. The flip-flop 110 may receive a data signal DI from the input terminal 102 via the data input D. The flip-flop 110 may receive a scan data signal SDI from the input terminal 103 via the scan data input SI. The flip-flop 110 may receive a clock signal CLK from the input terminal 104 via the clock input CK. The flip-flop 110 may output an output signal Q1 via the data output Q. The output signal Q from the flip-flop 110 may be inputted to the combinational logic circuit 130 and the scan path 140.

The flip-flop 120 may receive a scan enable signal SEI from the input terminal 101 via the scan enable input SE. The flip-flop 120 may receive a signal outputted from the combinational logic circuit 130 via the data input D. The flip-flop 120 may receive a signal outputted from the scan path 140 via the scan data input SI. The flip-flop 120 may receive a clock signal CLK from the input terminal 104 via the clock input CK. The flip-flop 120 may output an output signal Q2 via the output Q.

The scan path 140 may include an AND gate 141, buffers 142 and 144, and an inverter 143. The AND gate 141 may have an input receiving the output signal Q1 from the output Q of the flip-flop 110, an input receiving the scan enable signal SEI from the input terminal 101, and an output. The buffer 142, the inverter 143, and the buffer 144 may be sequentially connected in series. The buffer 142 may receive an output signal from the output of the AND gate 141. An output signal from the buffer 144 may be inputted to the scan data input SI of the flip-flop 120. The number and arrangement method of buffers and inverters connected between the output of the AND gate 141 and the scan data input SI of the flip-flop 120 may be variously modified. Particularly, the number of buffers and inverters connected between the output of the AND gate 141 and the scan data input SI of the flip-flop 120 may be determined according to operation time of the combinational logic circuit 130.

The integrated circuit described above may operate in normal mode or scan mode according to a scan enable signal SEI inputted from the input terminal 101. For example, if the scan enable signal SEI is at a low level, the integrated circuit may operate in normal mode. If the scan enable signal SEI is at a high level, the integrated circuit may operate in scan mode.

During the normal mode in which the scan enable signal SEI is at a low level, the flip-flops 110 and 120 may latch a data signal inputted through the data input D in synchronization with a clock signal CLK, respectively. In this case, since the scan enable signal SEI is at a low level, the AND gate 141 may output a signal of low level. Since the AND gate 141 keeps outputting a signal of low level during the normal node, any state shift of the buffers and inverters connected in series to the output of the AND gate 141 does not occur. Accordingly, power consumption can be minimized in the scan path 140.

On the other hand, during the scan mode in which the scan enable signal SEI is at a high level, the flip-flops 110 and 120 may latch a scan data signal inputted through the scan data input SI in synchronization with a clock signal CLK, respectively. In this case, since the scan enable signal SEI is at a high level, the AND gate 141 may deliver an output signal from the output Q to the buffer 142. Therefore, during the scan mode, the scan path 140 may deliver an output signal Q1 from the flip-flop 110 to the scan data input SI of the flip-flop 120. The combinational logic circuit 130 and the scan path 140 may be commonly connected to the output Q of the flip-flop 110, (i.e., a node N1). Since the output signal Q1 from the flip-flop 110 is simultaneously inputted to the combinational logic circuit 130 and the scan path 140 during the scan mode, a load of the node N1 may increase by that of the AND gate 141.

Figure 2:
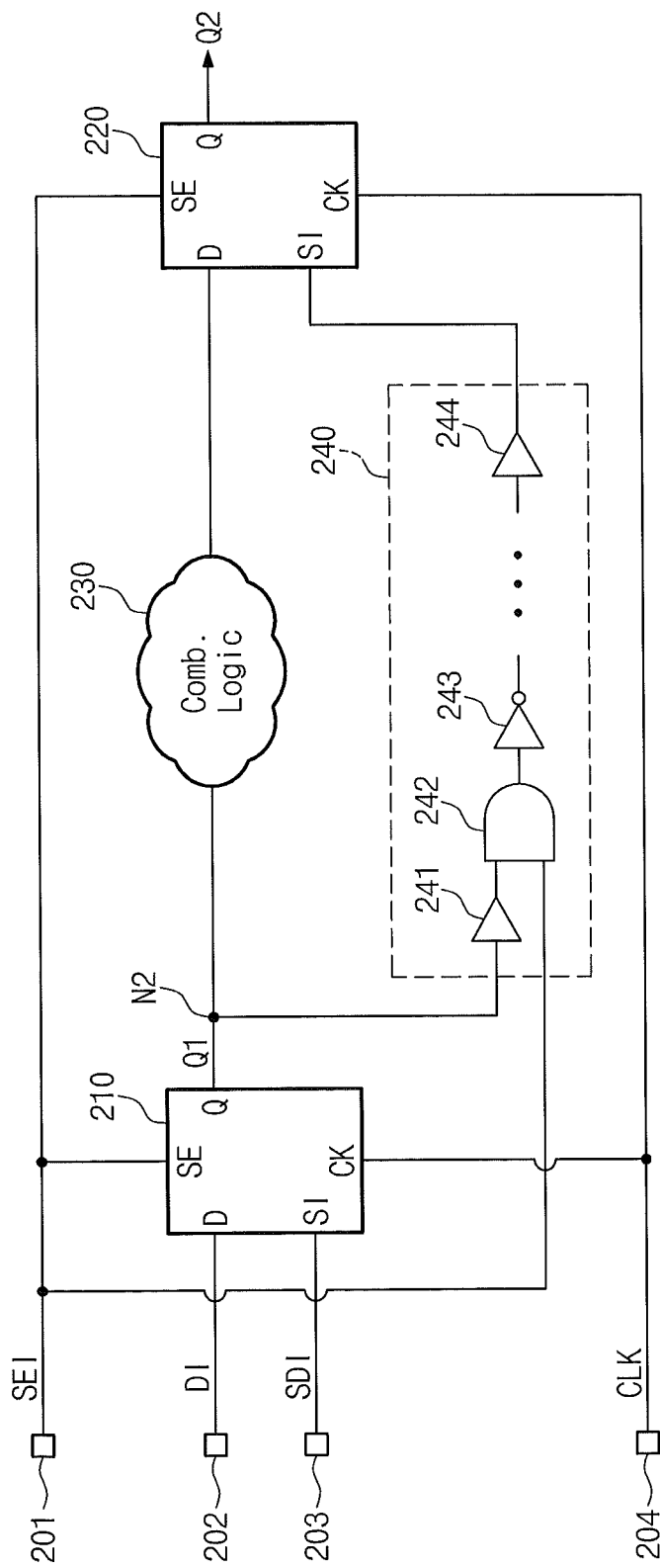
FIG. 2 is a diagram illustrating an integrated circuit according to another embodiment of the inventive concept.

FIG. 2 is a diagram illustrating an integrated circuit according to another embodiment of the inventive concept. Referring to FIG. 2, the integrated circuit may include input terminals 201 to 204, flip-flops 210 and 220, a combinational logic circuit 230, and a scan path 240. The scan path may include buffers 241 and 244, an AND gate 242, and an inverter 243. Unlike the scan path 140 of the integrated circuit shown in FIG. 1, the scan path 240 of the integrated circuit shown in FIG. 2 may include a buffer 241 between an output of the flip-flop 210 and an input of the AND gate 242. During normal mode in which a scan enable signal SEI is at a low level, the flip-flops 210 and 220 may latch a data signal inputted through a data input D in synchronization with a clock signal CLK, respectively. In this case, since the scan enable signal SEI is at a low level, the AND gate 242 may output a signal of low level. Since the AND gate 242 keeps outputting a signal of low level during the normal node, the state shift of buffers and inverters connected in series to the output of the AND gate 242 does not occur. Accordingly, power consumption can be minimized in the scan path 240.

During scan mode in which the scan enable signal SEI is at a high level, the flip-flops 210 and 220 may latch a scan data signal inputted through the scan data input SI in synchronization with a clock signal CLK, respectively. In this case, since the scan enable signal SEI is at a high level, the AND gate 242 may deliver an output signal from the output Q of the flip-flop 210 to the inverter 243. Therefore, during the scan mode, the scan path 240 may deliver an output signal Q1 from the flip-flop 210 to the scan data input SI of the flip-flop 220.

Particularly, since the buffer 241 in the scan path 240 includes a smaller number of transistors than the AND gate 242, a load of a node N2 is smaller than that of the node N1 shown in FIG. 1. However, since the buffer 241 maintains an operation state that delivers the output signal Q1 from the flip-flop 210 to the AND gate 242 in the normal mode as well as the scan mode, unnecessary switching power consumption may be caused in the buffer 241.

Figure 3:
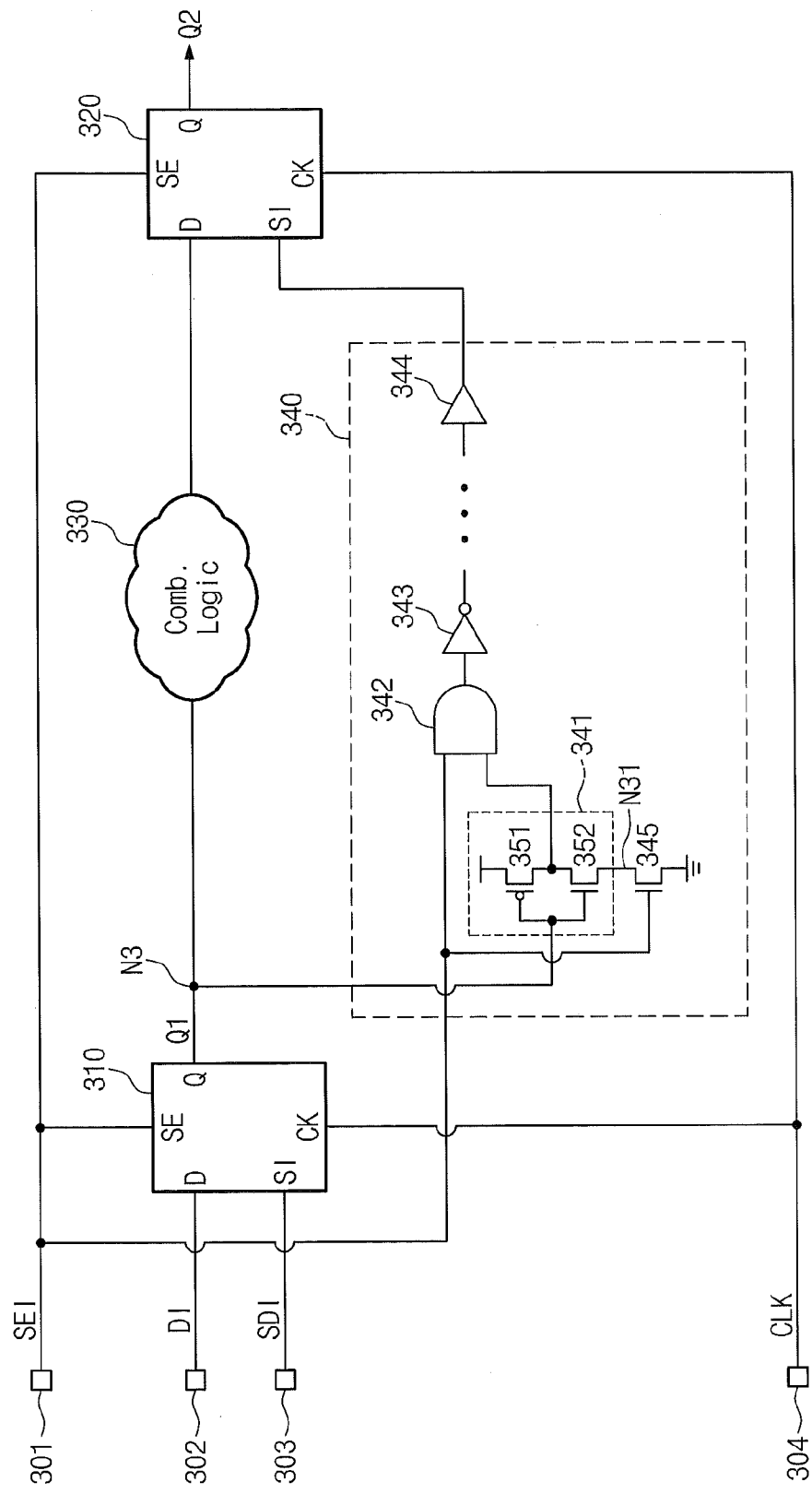
FIG. 3 is a diagram illustrating an integrated circuit according to still another embodiment of the inventive concept.

FIG. 3 is a diagram illustrating an integrated circuit according to still another embodiment of the inventive concept. Referring to FIG. 3, the integrated circuit may include input terminals 301 to 304, flip-flops 310 and 320, a combinational logic circuit 330, and a scan path 340. The flip-flops 310 and 320 may include a data input D, a scan data input SI, a scan enable input SE, a clock input CK, and an output Q, respectively. The flip-flop 310 may receive a scan enable signal SEI from the input terminal 301 via the scan enable input SE. The flip-flop 310 may receive a data signal DI from the input terminal 302 via the data input D. The flip-flop 310 may receive a scan data signal SDI from the input terminal 303 via the scan data input SI. The flip-flop 310 may receive a clock signal CLK from the input terminal 304 via the clock input CK. The flip-flop 310 may output an output signal Q1 via the data output Q. The output signal Q from the flip-flop 310 may be inputted to the combinational logic circuit 330 and the scan path 340.

Although it is shown in the present embodiment that the data signal DI inputted from the input terminal 302 and the scan data signal SDI inputted from the input terminal 303 are directly inputted to the data input D and the scan data input SI of the flip-flop 310, a signal outputted from another flip-flop or logic circuit that is not shown in the drawing may be inputted to the data input D and the scan data input SI of the flip-flop 310.

The flip-flop 320 may receive a scan enable signal SEI from the input terminal 301 via the scan enable input SE. The flip-flop 320 may receive a signal outputted from the combinational logic circuit 330 via the data input D. The flip-flop 320 may receive a signal outputted from the scan path 340 via the scan data input SI. The flip-flop 320 may receive a clock signal CLK from the input terminal 304 via the clock input CK. The flip-flop 320 may output an output signal Q2 via the output Q.

The scan path 340 may include an inverter 341, an AND gate 342, an inverter 343, a buffer 344, and an NMOS transistor 345. The inverter 341 may include a PMOS transistor 351 and an NMOS transistor 352 that are sequentially connected in series between a power voltage and a node N31. Gates of the PMOS transistor 351 and the NMOS transistor 352 may be connected to the output Q of the flip-flop 310. The NMOS transistor 345 has a drain connected to the node N31, a source connected to a ground voltage, and a gate connected to a scan enable signal.

The AND gate 141 may have an input receiving a scan enable signal SE, an input connected to an output of the inverter 341, and an output. The inverter 343 and the buffer 344 may be sequentially connected in series between the output of the AND gate 342 and the scan data input SI of the flip-flop 320. The number and arrangement method of buffers and inverters connected between the output of the AND gate 342 and the scan data input SI of the flip-flop 320 may be variously modified. Particularly, the number of buffers and inverters connected between the output of the AND gate 342 and the scan data input SI of the flip-flop 320 may be determined according to operation time of the combinational logic circuit 330.

The NMOS transistor 345 may operate as a switching device. That is, the NMOS transistor 345 may be turned on during scan mode in which the scan enable signal is at a high level. As a result, the inverter 341 may deliver the output signal Q from the flip-flop 310 to the AND gate 342. Since the NMOS transistor 345 is turned off during normal mode in which the scan enable signal is at a low level, the node N31 connected to the inverter 341 may be floated. Accordingly, the inverter 341 may not operate. As a result, all devices in the scan path 340 are placed in a non-operational state during the normal mode, and there is little power consumption in the scan path 340.

Figure 4:
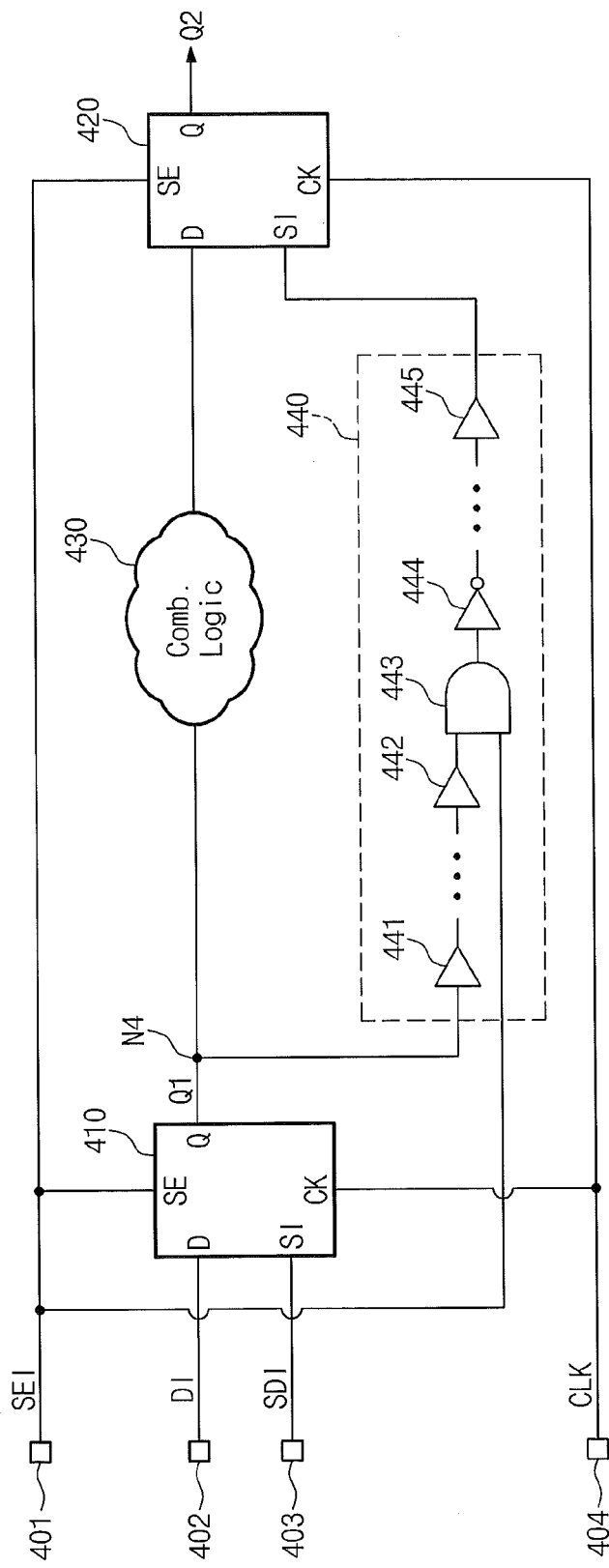
FIG. 4 is a diagram illustrating a modified example of the scan path in the integrated circuit of FIG. 2.

FIG. 4 is a diagram illustrating a modified example of a scan path in the integrated circuit of FIG. 2. Referring to FIG. 4, the integrated circuit may include input terminals 401 to 404, flip-flops 410 and 420, a combinational logic circuit 430, and a scan path 440. The scan path 440 may include buffers 441, 442 and 445, an AND gate 443, and an inverter 444. Unlike the scan path of the integrated circuit shown in FIG. 1, the scan path 440 of the integrated circuit shown in FIG. 4 may include a plurality of buffers 441 and 442 between an output Q of the flip-flop 410 and an input of the AND gate 443. That is, if the total number of buffers and inverters required in the scan path 440 is n, n-k buffers or inverters may be arranged between the output Q of the flip-flop 410 and the input of the AND gate 443, and k buffer or inverters may be arranged between an output of the AND gate 443 and a scan data input SI of the flip-flop 420.

Figure 5:
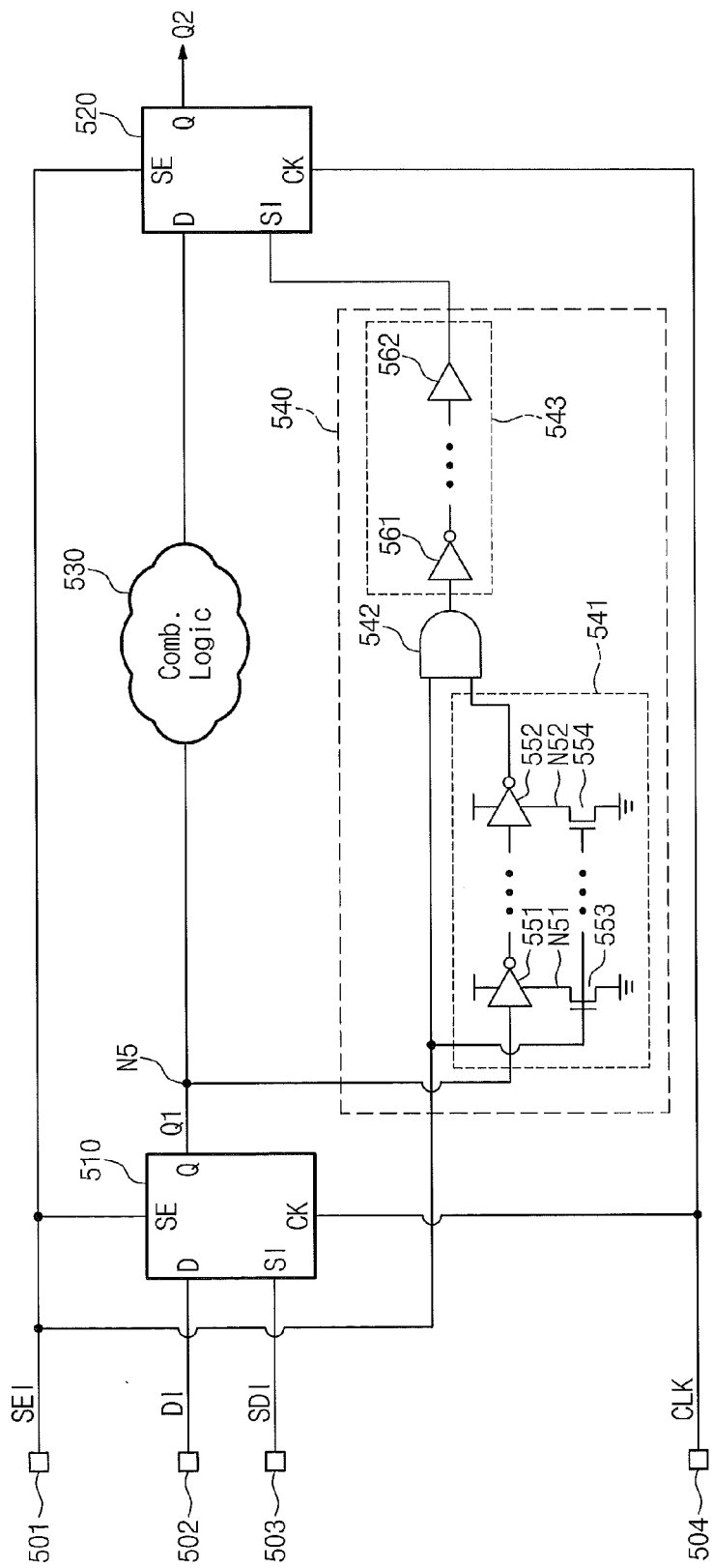
FIG. 5 is a diagram illustrating an integrated circuit according to another embodiment of the inventive concept.

FIG. 5 is a diagram illustrating an integrated circuit according to another embodiment of the inventive concept. Referring to FIG. 5, the integrated circuit may include input terminals 501 to 504, flip-flops 510 and 520, a combinational logic circuit 530, and a scan path 540. The scan path 540 may include a first delay circuit 541, a logic gate 542, and a second delay circuit 543. The first delay circuit 541 may include inverters 551 and 552 and NMOS transistors 553 and 554. The inverters 551 and 552 may correspond to nodes N51 and N52, respectively, and may be connected between a power voltage and the corresponding nodes N51 and N52, respectively. The inverters 551 and 552 may be sequentially connected in series between an output Q of the flip-flop 510 and an input of the logic gate 542. The NMOS transistors 553 and 554 may correspond to the nodes N51 and N52 connected to the inverters 551 and 552, respectively. The drains of the respective NMOS transistors 553 and 554 may be connected to corresponding nodes, and the sources thereof may be connected to a ground voltage. Also, the gates of the respective NMOS transistors 553 and 554 may be connected to a scan enable signal SEI.

In the present embodiment, the logic gate 542 may be an AND gate. The AND gate may include an input receiving a scan enable signal, an input receiving an output signal of the first delay circuit 542, and an output. The second delay circuit 543 may include an inverter 561 and a buffer 562 that are sequentially connected in series between an output of the logic gate 542 and a scan data input SI of the flip-flop 520. The number and arrangement method of inverters 551, 552 and 561 and buffers 562 included in the first delay circuit 541 and the second delay circuit 543 of the scan path 540 may be variously modified. When the total number of buffers and inverters required in the scan path 540 is n, n-k inverters may be arranged in the first delay circuit 541, and k buffers or inverters may be arranged in the second delay circuit 543.

All of the NMOS transistors 553 and 554 may be turned on in scan mode in which the scan enable signal SEI is at a high level. Therefore, the output signal Q1 outputted from the flip-flop 510 by the inverters 551 and 552 may be delivered to the scan data input SI of the flip-flop 520 through the AND gate 542 and the second logic circuit 543. Since all of the NMOS transistors 553 and 554 may be turned off in normal mode in which the scan enable signal SEI is at a low level, the inverters 551 and 552 may be placed in a non-operational state. Therefore, unnecessary power consumption by the inverters 551 and 552 in the scan path 540 can be minimized during normal mode. Since the inverters 551 and 552 of the scan path 540 are in the non-operational state, reduction of the operation speed of the combinational logic 530 by the inverters 551 and 552 can be minimized when the output signal Q1 from the output Q of the flip-flop 510 is changed from a low level to a high level or from a high level to a low level.

Figure 6:
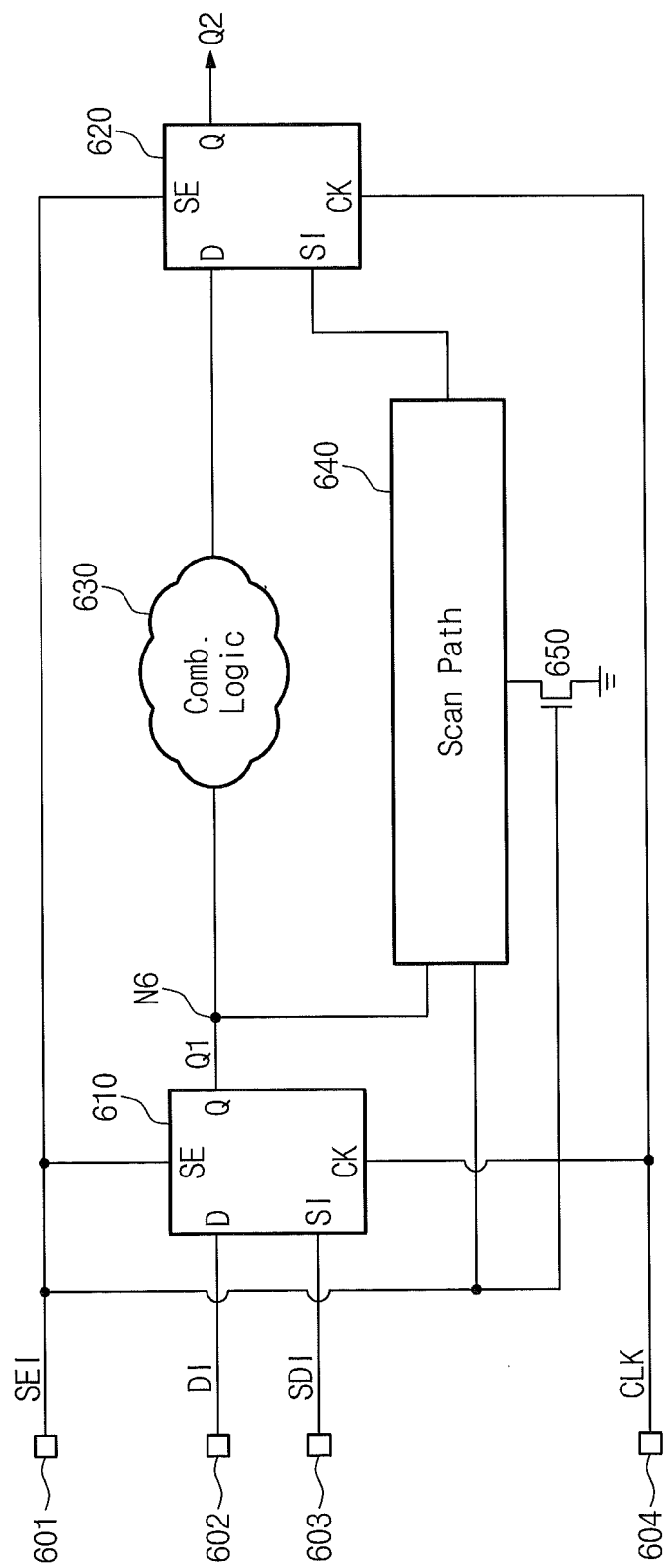
FIG. 6 is a diagram illustrating an integrated circuit according to still another embodiment of the inventive concept.

FIG. 6 is a diagram illustrating an integrated circuit according to still another embodiment of the inventive concept. Referring to FIG. 6, the integrated circuit may include input terminals 601 to 604, flip-flops 610 and 620, a combinational circuit 630, a scan path 640, and a switching circuit 650. The switching circuit 650 may be connected between a ground voltage and a ground terminal of the scan path 640, and may operate in response to a scan enable signal SEI. The switching circuit 650 may be configured with an NMOS transistor. The switching circuit 650 may be turned off when the scan enable signal SEI is at a low level to float the ground terminal of the scan path 640. As a result, the scan path 640 may be set to a non-operational state during normal mode in which the scan enable signal SEI is at a low level. While the scan enable signal is at a high level, the switching circuit 650 may be turned, and the scan path 640 may be set to an operational state.

In the integrated circuit shown in FIG. 6, power consumption in the scan path 640 can be prevented during normal mode by setting the scan path 640 to the operational state only during scan mode, and setting the scan path 640 to the non-operational state during normal mode.

Figure 7:
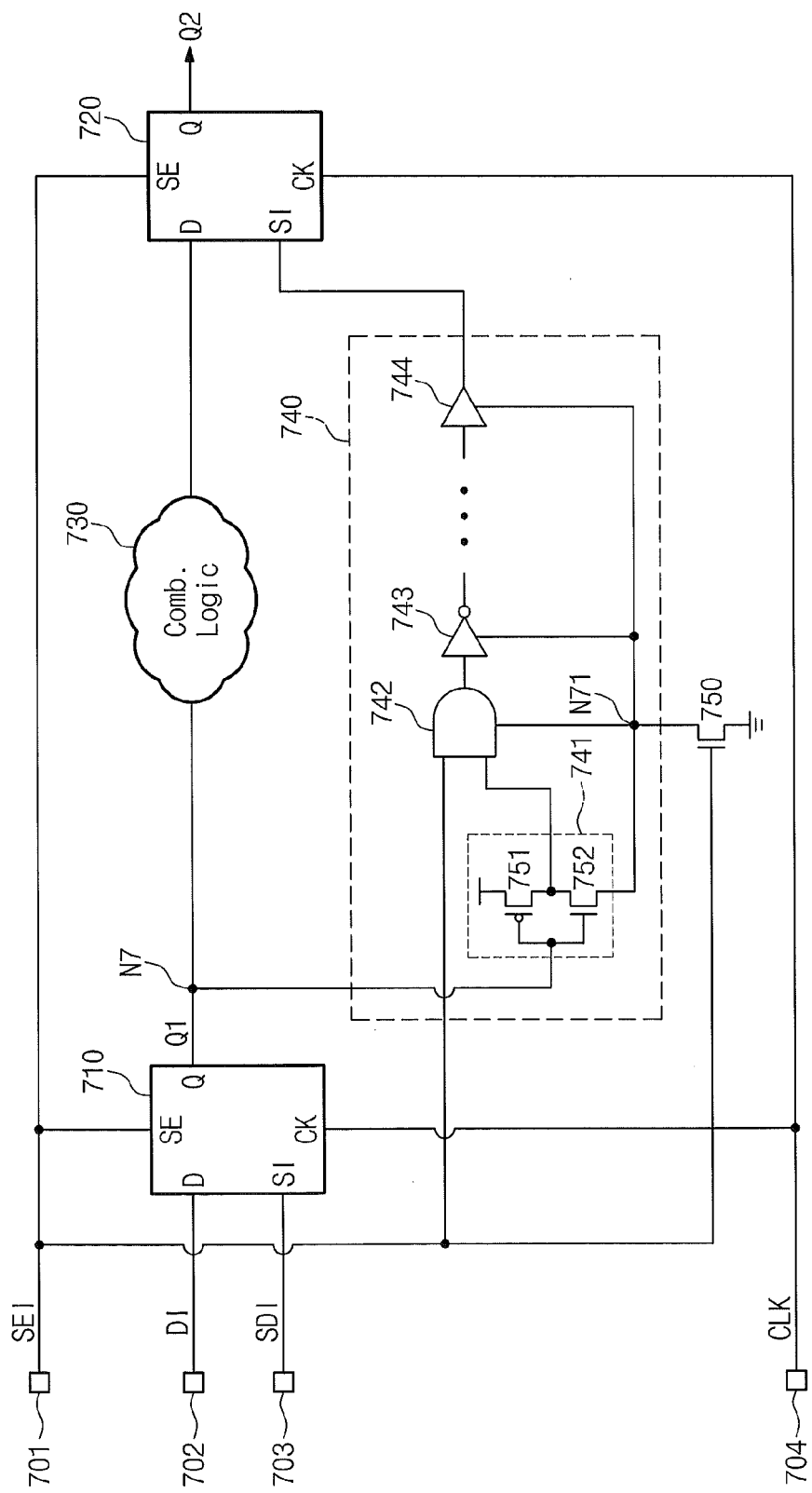
FIG. 7 is a diagram illustrating an exemplary configuration of the scan path in the integrated circuit of FIG. 6.

FIG. 7 is a diagram illustrating an exemplary configuration of the scan path in the integrated circuit of FIG. 6. Referring to FIG. 7, the integrated circuit may include input terminals 701 to 704, flip-flops 710 and 720, a combinational logic circuit 730, a scan path 740, and a switching device 750. The scan path 740 may include an inverter circuit 741, a logic gate 742, an inverter 743, and a buffer 744. The inverter circuit 741 may include a PMOS transistor 751 and an NMOS transistor 752 that are sequentially connected in series between a power voltage and a node N71. Gates of the PMOS transistor 751 and the NMOS transistor 752 may be connected to an output signal Q1 outputted from the flip-flop 710.

In the present embodiment, the logic gate 742 may be an AND gate. The logic gate 742 may have an input receiving a scan enable signal SEI, an input receiving an output signal of the inverter circuit 741, and an output. The inverter 743 and the buffer 744 may be sequentially connected in series between the output of the logic gate 742 and the scan data input SI of the flip-flop 720. A plurality of inverters and buffers may be connected between the output of the logic gate 742 and the scan data input SI of the flip-flop 720. A ground terminal of the inverter circuit 741, i.e., the source of the NMOS transistor 752, a ground terminal of the logic gate 742, a ground terminal of the inverter 743, and a ground terminal of the buffer 744 may be connected to a switching device 750 through the node N71. In the present invention, the switching device 750 may include an NMOS transistor connected between the node N71 and the ground voltage. The gate of the switch device 750 may be connected to the scan enable signal SEI.

During normal mode, if the switching device 750 is turned on in response to the scan enable signal SEI of low level, the node N71 (i.e., the ground terminal of the inverter circuit 741) the logic gate 742, the inverter 743 and the buffer 744 in the scan path 740 may be floated. Accordingly, since a current path between the ground voltage and the power terminals of each of the inverter circuit 741, the logic gate 742, the inverter 743 and the buffer 744 is not formed, a leakage current does not flow, and unnecessary power consumption can be prevented in the scan path.

Although a configuration similar to that of the scan path 340 shown in FIG. 3 has been described as an example of the concrete configuration of the scan path 740 shown in FIG. 7, the ground terminal of all components in the scan path 440 shown in FIG. 4 (i.e., the buffers 441, 442 and 445, the logic gate 443 and the inverter 444) may be connected to the switching device 750 shown in FIG. 7.

Even in this case, since the ground terminal of all components in the scan path 440 shown in FIG. 4 (i.e., the buffers 441, 442 and 445, the logic gate 443 and the inverter 444 are floated) unnecessary power consumption can be reduced in the scan path.

In other words, in spite of the configuration of the scan path in the integrated circuit, unnecessary power consumption can be prevented in the scan path during normal mode by connecting the ground terminal of the components of the scan path to the switching device 750. According to an embodiment of the inventive concept, unnecessary power consumption by a scan path can be minimized upon normal operation in an integrated circuit including a scan path.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

That which is claimed is:

1. An integrated circuit device, comprising:
a first latch responsive to a clock signal, said first latch comprising a data input terminal, a scan input terminal, a scan enable terminal and an output terminal;
a second latch responsive to the clock signal, said second latch comprising a data input terminal, a scan input terminal, a scan enable terminal and an output terminal;
a scan path responsive to a scan enable signal, said scan path configured to selectively pass a signal from the output terminal of said first latch to the scan input terminal of said second latch when the scan enable signal is active; and
a switch responsive to the scan enable signal, said switch having a first current carrying terminal electrically coupled to said scan path, said switch configured to disable said scan path from passing the signal from the output terminal of said first latch to the scan input terminal of said second latch when the scan enable signal is in an inactive state.

2. The device of claim 1, wherein the scan enable terminals of said first and second latches are configured to receive the scan enable signal; and wherein said switch is configured to reduce power consumption in said scan path when the scan enable signal switches from an active state to the inactive state.

3. The device of claim 2, wherein said scan path comprises at least one delay device having a second current carrying terminal electrically coupled to the first current carrying terminal of said switch.

4. The device of claim 3, wherein said switch is an NMOS pull-down transistor.

5. The device of claim 3, wherein said scan path comprises:
an inverter having an input terminal configured to receive the signal from the output terminal of said first latch; and
a logic device having a first input configured to receive the scan enable signal and a second input electrically coupled to an output of said inverter.

6. The device of claim 3, wherein said scan path comprises:
a plurality of inverters electrically coupled in series, said plurality of inverters comprising a first inverter having an input terminal configured to receive the signal from the output terminal of said first latch; and
a logic device having a first input configured to receive the scan enable signal and a second input electrically coupled to an output of a last one of said plurality of inverters.

7. The device of claim 5, wherein said inverter comprises an NMOS pull-down transistor having a source terminal electrically connected to the first current carrying terminal of said switch.

8. The device of claim 5, wherein said logic device has a current carrying terminal electrically connected to the first current carrying terminal of said switch.

9. The device of claim 5, wherein said logic device is an AND-type or NAND-type logic gate.

10. The device of claim 1, further comprising a combinational logic circuit configured to receive the signal from the output terminal of said first latch, said combinational logic circuit configured to generate a signal at the data input terminal of said second latch.

11. An integrated circuit comprising:
first and second flip-flops each of said flip-flops comprising a data input, a scan data input, a scan enable input receiving a scan enable signal, and a data output, respectively; and
a scan path connected between the data output of the first flip-flop and the scan data input of the second flip-flop, and operating while the scan enable signal is representing a scan mode,
wherein the scan path comprises:
an inverter connected to a power voltage and a first node, and comprising an input connected to the data output of the first flip-flop and an output;

a logic gate comprising a first input receiving the scan enable signal, a second input receiving a signal outputted from the output of the inverter, and an output;

a delay circuit connected between the output of the logic gate and the scan data input of the second flip-flop; and a switching device connected between a ground voltage and the first node of the inverter, and controlled by the scan enable signal, and the switching device sets the inverter to a non-operational state while the scan enable signal is representing a data mode.

12. The integrated circuit of claim 11, wherein the logic gate is an AND gate.

13. The integrated circuit of claim 11, wherein the switching device comprises a transistor comprising a drain connected to the first node of the inverter, a source connected to the ground voltage, and a gate connected to the scan enable signal.

14. The integrated circuit of claim 11, wherein the inverter comprises first and second transistors sequentially connected in series between the power voltage and the first node, and gates of the first and second transistors are connected to the data output of the first flip-flop.

15. The integrated circuit of claim 11, further comprising a combinational logic connected between the data output of the first flip-flop and the data input of the second flip-flop.

16. An integrated circuit comprising:
first and second flip-flops each of said flip-flops comprising a data input, a scan data input, a scan enable input receiving a scan enable signal, and a data output, respectively;
a first delay circuit receiving the scan enable signal and a signal outputted from the data output of the first flip-flop, and outputting a first delay signal;
a logic gate comprising a first input receiving the scan enable signal, a second input receiving the first delay signal from the first delay circuit, and an output; and
a second delay circuit connected between the output of the logic gate and the scan data input of the second flip-flop,
wherein the first delay circuit comprises:
a plurality of connection nodes;
a plurality of inverters corresponding to the plurality of connection nodes, respectively, connected between a power voltage and the corresponding connection nodes, respectively, and connected in series between the data output of the first flip-flop and the second input of the logic gate; and
a plurality of switching devices corresponding to the plurality of connection nodes, respectively, connected between a ground voltage and the corresponding connection nodes, respectively, and controlled by the scan enable signal, and
each of the switching devices sets a corresponding inverter to a non-operational state while the scan enable signal is representing a data mode.

17. The integrated circuit of claim 16, wherein the logic gate is an AND gate.

18. The integrated circuit of claim 16, wherein each of the switching devices comprises a MOS transistor comprising a drain connected to the corresponding connection node, a source connected to the ground voltage, and a gate connected to the scan enable signal.

19. The integrated circuit of claim 16, further comprising a combinational logic connected between the data output of the first flip-flop and the data input of the second flip-flop.

* * * * *